United States Patent
Kataoka et al.

(10) Patent No.: US 7,948,728 B2
(45) Date of Patent: May 24, 2011

(54) SEMICONDUCTOR DEVICE AND METHOD FOR INSPECTING THE SAME

(75) Inventors: Shinichiro Kataoka, Osaka (JP); Takehiro Yano, Osaka (JP)

(73) Assignee: Panasonic Corporation, Osaka (JP)

( * ) Notice: Subject to any disclaimer, the term of this patent is extended or adjusted under 35 U.S.C. 154(b) by 497 days.

(21) Appl. No.: 12/054,968

(22) Filed: Mar. 25, 2008

(65) Prior Publication Data

US 2008/0239605 A1    Oct. 2, 2008

(30) Foreign Application Priority Data

Mar. 29, 2007 (JP) ................................ 2007-089349

(51) Int. Cl.
*H02H 3/24* (2006.01)
*H02H 9/00* (2006.01)
*H02H 3/00* (2006.01)

(52) U.S. Cl. ............................... 361/92; 361/56; 361/79

(58) Field of Classification Search .................... 361/92
See application file for complete search history.

(56) References Cited

U.S. PATENT DOCUMENTS

| 5,903,415 A | * | 5/1999 | Gill | 360/323 |
| 6,040,968 A | * | 3/2000 | Duvvury et al. | 361/56 |
| 7,715,165 B2 | * | 5/2010 | Gammel et al. | 361/111 |

FOREIGN PATENT DOCUMENTS

JP        6-085030        3/1994

* cited by examiner

*Primary Examiner* — Dharti H Patel
(74) *Attorney, Agent, or Firm* — Hamre, Schumann, Mueller & Larson, P.C.

(57) ABSTRACT

A semiconductor device of the present invention includes: a power input terminal; an internal power supply circuit that converts a voltage supplied from the outside to the power input terminal into a predetermined voltage; an analog circuit connected to an output side of the internal power supply circuit; an internal power output terminal connected to the output side of the internal power supply circuit; a logic circuit power input terminal; a logic circuit connected to the logic circuit power input terminal; and interterminal wiring connecting the internal power output terminal to the logic circuit power input terminal. The internal power supply circuit has a configuration of supplying power to the analog circuit and the logic circuit, and in a package assembly (finished product), a resting current in the logic circuit can be inspected without being influence by a consumption current in the analog circuit.

17 Claims, 5 Drawing Sheets

SEMICONDUCTOR DEVICE AND METHOD FOR INSPECTING THE SAME

BACKGROUND OF THE INVENTION

1. Field of the Invention

The present invention relates to a semiconductor device having a configuration in which a logic circuit and an analog circuit that use outputs from the same internal power supply circuit as power voltage supply sources are provided, and a resting current in the logic circuit can be inspected, and a method for inspecting the semiconductor device.

2. Description of Related Art

Some conventional semiconductor devices including an analog circuit and a digital circuit have a configuration in which an internal power output pad, an analog portion power pad, and a logic portion power pad are provided, and during the assembly of a package, wires are stretched from the three pads to one terminal (leads in the package connected to a pin). The inspection of a resting current in the semiconductor device (inspection for whether or not a resting current is within the standards) is conducted by measuring a consumption current of the logic circuit that has a consumption current smaller than that of the analog circuit in a wafer state (pellet state) before the assembly of the package (before the connection of the wires). With this method, a defective product can be removed at a high probability with a narrow tolerance.

The internal power output pad, an analog portion power pad, and a logic portion power pad can be led out individually as three terminals to be connected outside of the semiconductor device so that the consumption current of the logic circuit can be inspected even after the assembly of the package. However, in this configuration, a one-terminal configuration is divided into a plurality of terminals, which may degrade an electrostatic discharge (ESD) tolerance.

Furthermore, the circuits connected to the three terminals are designed so as to have the same potential. However, due to the disconnection of the external connection, or the noise and the shift of an application timing in an inspection process in which a condition is set for each terminal, a voltage is generated among the three terminals and may break the semiconductor device. Therefore, it is necessary to provide three pads: the internal power output pad, the analog portion power pad, and the logic portion power pad, and form a one-terminal configuration by stretching wires from the three pads to one terminal during assembly of a package.

A method for inspecting a semiconductor integrated circuit as described above (for example, see JP 6(1994)-85030 A) will be described with reference to FIG. 6. FIG. 6 is a plan view showing a configuration of a conventional semiconductor device 220. A semiconductor chip 200a includes an internal power supply circuit 202, an analog circuit 203, and a logic circuit 204. An external power input pad 205 and an internal power output pad 206 are connected to the internal power supply circuit 202. An analog portion power pad 207 is connected to the analog circuit 203, and a logic portion power pad 208 is connected to the logic circuit 204. A lead frame 201 has an external power terminal 209 and an internal power terminal 210.

The external power terminal 209 and the external power input pad 205 are connected through a wire, whereby a voltage is supplied to the internal power supply circuit 202. The internal power supply circuit 202 converts the supplied voltage into a predetermined voltage. The internal power output pad 206 is connected to the internal power terminal 210 through a wire, whereby the voltage converted in the internal power supply circuit 202 is supplied to the internal power terminal 210. The internal power terminal 210 is connected to the logic portion power pad 208 and the analog portion power pad 207 through wires, whereby the voltage converted in the internal power supply circuit 202 is supplied to the logic circuit 204 and the analog circuit 203.

In the semiconductor device 220 as described above, a consumption current flowing to the logic portion power pad 208 is measured before the assembly of a package (before the wire-bonding between the terminal and the pads), whereby the inspection of a resting current in the logic circuit 203 with a narrow standard width can be conducted without being influenced by the analog circuit 203.

According to another method for inspecting a resting current in a semiconductor device, the operations of all the circuits other than the logic circuit 204 are stopped (brought into a state in which no consumption current flows), and conditions are set (voltages are applied) from the outside, using a plurality of signal lines (not shown) simultaneously controlling the logic circuit 204 from the analog circuit 203. By inspecting a resting current as described above, the inspection of only the logic circuit 204 can be conducted without being influenced by the analog circuit 203.

Furthermore, FIG. 7 is a block diagram showing a semiconductor chip 200b before being wire-bonded to a lead frame (not shown) in a semiconductor device with a configuration different from that in FIG. 6. The semiconductor chip 200b has a configuration in which the logic portion power pad 208, the analog portion power pad 207, and the internal power output pad 206 of the semiconductor chip 200a shown in FIG. 6 are connected respectively through wires. The inspection of a wafer (pellet) before the semiconductor chip 200b is wire-bonded to the lead frame of the logic circuit 204 is conducted by newly providing a terminal in the logic circuit 204 or providing a test pad (contact portion provided on the semiconductor chip for applying a voltage from the outside during the inspection of a wafer), applying a voltage, and measuring a consumption current.

However, according to the conventional inspection method shown in FIG. 6, in the package assembly (finished product) after wire-bonding, the internal power output pad 206, the analog portion power pad 207, and the logic portion power pad 208 are wire-bonded to the internal power terminal 210, so that it is difficult to measure a resting current only in the logic circuit 204.

Therefore, even if the inspection on a wafer (pellet) is conducted, a defective product cannot be detected when the defective product occurs in various processes leading to the subsequent package assembly (finished product), for example, due to an assembly stress, damage during an inspection process, damage caused by ESD, and the like.

Furthermore, according to another conventional inspection method as described above, it is necessary to stop the operations of all the circuits other than the logic circuit 204, and the number of terminals and terminal peripheral circuits for setting conditions through signal lines increases, raising the cost. Furthermore, it is difficult in terms of a circuit configuration to bring all the circuits other than the logic circuit 204 into a state in which no consumption current flows, and in the analog circuit 203 whose operation is stopped, other than the logic circuit 204, a leakage current flows to make it difficult to measure a resting current in the logic circuit 204 with good precision.

Furthermore, the inspection of the semiconductor device 200b shown in FIG. 7 has high cost since pads or terminals are provided newly, which makes it difficult to enhance inspection precision.

SUMMARY OF THE INVENTION

The present invention relates to a configuration in which an internal power supply circuit supplies power to an analog circuit and a logic circuit, and its object is to provide a semiconductor device in which the inspection of a resting current in the logic circuit can be conducted without being influenced by a consumption current of the analog circuit in a package assembly (finished product).

In order to solve the above problem, a semiconductor device of the present invention includes: a power input terminal; an internal power supply circuit that converts a voltage supplied from the outside to the power input terminal into a predetermined voltage; an analog circuit connected to an output side of the internal power supply circuit; an internal power output terminal connected to the output side of the internal power supply circuit; a logic circuit power input terminal; a logic circuit connected to the logic circuit power input terminal; and interterminal wiring connecting the internal power output terminal to the logic circuit power input terminal.

Furthermore, according to a method for inspecting a semiconductor device of the present invention, in a method for inspecting the above-mentioned semiconductor device, a voltage is supplied to the logic circuit power input terminal from the outside of the semiconductor device, and a resting current flowing to the logic circuit power input terminal is measured, whereby the quality of the semiconductor device is determined, while the internal power output terminal and the logic circuit power input terminal are not connected to each other with the interterminal wiring.

According to the present invention, the internal power supply circuit supplies power to the analog circuit in the semiconductor chip, and supplies power to the logic circuit from the terminal connected to the internal power supply circuit via the outside of the semiconductor chip, whereby a resting current in the logic circuit can be inspected in a package assembly without being influenced by a consumption current in the analog circuit.

DETAILED DESCRIPTION OF THE INVENTION

Figure 1:
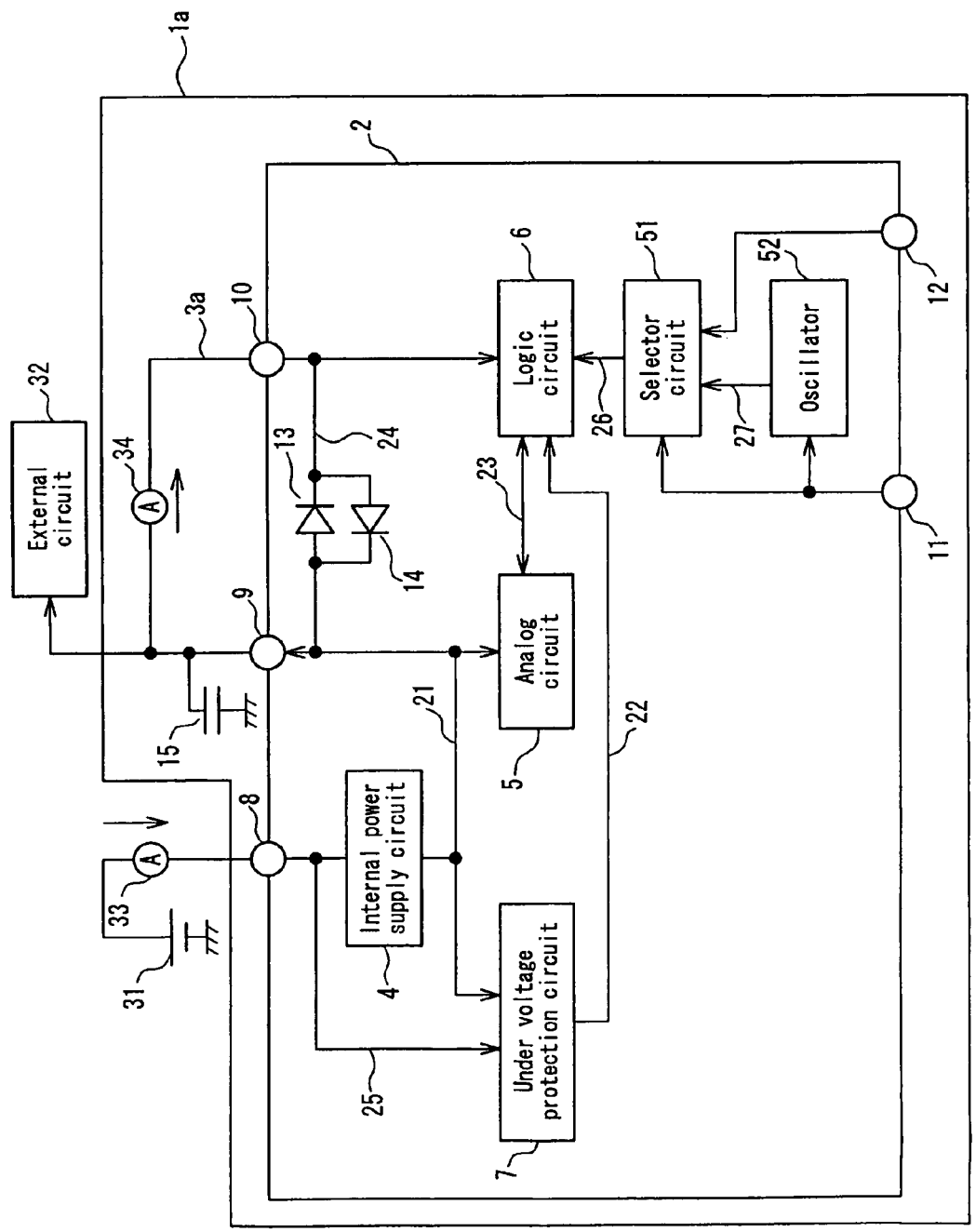
FIG. 1 is a block diagram showing a configuration of a semiconductor device according to Embodiment 1 of the present invention.

A semiconductor device and a method for producing the semiconductor device according to the present invention can assume the following various aspects based on the above configuration. More specifically, in the above semiconductor device, the output side of the internal power supply circuit and a power input side of the logic circuit can be connected to each other, and an ESD (electrostatic discharge) protection circuit can be inserted to be connected. According to this configuration, when a voltage at a predetermined level or more is applied between the internal power output terminal and the logic circuit power input terminal, a current flows therebetween, so that the degradation in ESD tolerance caused by providing the internal power output terminal and the logic circuit power input terminal can be reduced.

Furthermore, the ESD protection circuit can be composed of two diodes connected in parallel in directions opposite to each other.

Furthermore, a capacitor with one end grounded can be connected to the interterminal wiring.

Furthermore, the above-mentioned semiconductor device can include: an under voltage protection circuit that resets the logic circuit when at least one voltage of the power input terminal and the output side of the internal power supply circuit is a predetermined voltage or less; an oscillator that generates a dock signal; a clock input terminal that receives a clock signal from the outside; and a selector that selects either one of the clock signal generated by the oscillator and the dock signal input via the dock input terminal, as a clock signal of the logic circuit.

Furthermore, the selector can stop an operation of the oscillator, when the clock signal input via the clock input terminal is used as the clock signal of the logic circuit.

Furthermore, the internal power output terminal and the logic circuit power input terminal can be formed as a common terminal.

Furthermore, a filter can be formed in the interterminal wiring. According to this configuration, clock noise from the logic circuit to the analog circuit can be reduced.

Furthermore, the filter has a coil or a resistor, and a capacitor with one end grounded, the capacitor being provided between the coil or resistor and the logic circuit power input terminal or between the coil or resistor and the internal power output terminal.

Furthermore, in a method for inspecting a semiconductor device according to the present invention, the above-mentioned semiconductor device may be inspected by resetting the logic circuit with the under voltage protection circuit.

Furthermore, the logic circuit may be reset with the under voltage protection circuit by setting a voltage of the power input terminal to be the predetermined voltage or less.

Furthermore, in a method for inspecting the above-mentioned semiconductor device, the quality of the semiconductor device may be determined by inputting a clock signal to the logic circuit via the clock input terminal to set a logic state of each gate of the logic circuit, and measuring a resting current flowing to the logic circuit power input terminal.

Furthermore, the logic state of each gate of the logic circuit may be changed, and a resting current flowing to the logic circuit power input terminal may be measured.

Furthermore, a resting current flowing to the logic circuit power input terminal may be measured while the logic circuit is reset.

Furthermore, an electric motor of the present invention includes: the above-mentioned semiconductor device, including a level shift portion driving circuit that increases an output signal driving ability of the logic circuit; a level shift portion that converts an output signal from the level shift portion driving circuit into a high-voltage signal; a motor portion; and a power MOSFET portion that is driven with an output signal from the level shift portion to drive the motor portion, wherein the semiconductor device, the level shift portion, and the power MOSFET portion are formed on the same substrate.

Hereinafter, a semiconductor device and a method for inspecting the same according to embodiments of the present invention will be described with reference to the drawings.

Embodiment 1

FIG. 1 is a block diagram showing a configuration of a semiconductor device 1a according to Embodiment 1 of the present invention. The semiconductor device 1a has a semiconductor chip 2 and interterminal wiring 3a.

A power input terminal 8 placed on the semiconductor chip 2 is connected to an external power source 31. An internal power supply circuit 4 is supplied with a voltage from the external power source 31 via the power input terminal 8, converts the supplied voltage into a predetermined voltage, and supplies it to each part of the semiconductor device 1a and an external circuit 32. An under voltage protection circuit 7 is connected to the power input terminal 8 through a signal line 25, and is connected to an output side of the internal power supply circuit 4 through a signal line 21. The under voltage protection circuit 7 determines whether or not each of the voltages output from the power input terminal 8 and the internal power supply circuit 4 is smaller than a predetermined level (for example, the lowest voltage at which an analog circuit 5 is operable, the lowest voltage at which a logic circuit 6 is operable). When the voltage is smaller than the predetermined level, the under voltage protection circuit 7 inputs a signal for resetting the logic circuit 6 to the logic circuit 6 through a reset line 22.

The analog circuit 5 receives power from the internal power supply circuit 4 through the signal line 21. Furthermore, the analog circuit 5 also can receive power from the power input terminal 8 (wiring is omitted in the figure). The internal power output terminal 9 placed on the semiconductor chip 2 is connected to an output side of the internal power supply circuit 4 through the signal line 21. Furthermore, the logic circuit power input terminal 10 placed on the semiconductor chip 2 is connected to the logic circuit 6. When the logic circuit 6 is reset, the logic circuit 6 regulates, for example, an output from the analog circuit 5. The interterminal wiring 3a connects the internal power output terminal 9 to the logic circuit power input terminal 10. One end of a capacitor 15 is connected to the interterminal wiring 3a, and the other end thereof is grounded, thereby removing noise in a current flowing through the interterminal wiring 3a and preventing oscillation. The external circuit 32 is connected to the internal power output terminal 9 to receive power.

A bypass line 24 is placed on the semiconductor chip 2 so as to connect the internal power output terminal 9 to the logic circuit power input terminal 10. Diodes 13, 14, arranged in parallel in opposite directions, are placed on the bypass line 24. During an ordinary operation, the internal power output terminal 9 and the logic circuit power input terminal 10 are short-circuited through the interterminal wiring 3a, and an interterminal voltage of the diodes 13, 14 does not reach a forward diode voltage, so that a current does not flow through the bypass line 24. When a voltage equal to or higher than the forward diode voltage of the diodes 13, 14 is applied between the internal power output terminal 9 and the logic circuit power input terminal 10, a current flows through the bypass line 24, and a voltage equal to or higher than a predetermined level is not applied between the internal power output terminal 9 and the logic circuit power input terminal 10.

A control signal is input to a selector switching input terminal 11 from the outside. An oscillator 52 generates a clock signal of the logic circuit 6 in accordance with the control signal from the selector switching input terminal 11. The generated clock signal is input to the logic circuit 6 through signal lines 27, 26. The clock input terminal 12 is used for receiving a clock signal of the logic circuit 6 from the outside. Furthermore, the logic state of the logic circuit 6 can be set with a signal input to the clock input terminal 12. The selector circuit 51 supplies either a clock signal of the oscillator 52 or an external clock signal input to the clock input terminal 12 to the logic circuit 6 in accordance with an input signal from the selector switching input terminal 11. When the selector circuit 51 supplies the external clock signal from the clock input terminal 12 to the logic circuit 6, the oscillator 52 may stop oscillation. When the oscillator 52 stops, noise from the oscillator 52 to various circuits is reduced.

As in an integrated circuit, particularly, a CMOS circuit, the logic circuit 6 has a consumption current smaller than that in the analog circuit 5. The logic circuit 6 is operated using a voltage supplied from the internal power supply circuit 4 via the logic circuit power input terminal 10 and a clock signal supplied from the selector circuit 51. Furthermore, the logic circuit 6 is reset with a signal supplied from the under voltage protection circuit 7 through the reset line 22. The logic circuit 6 is connected to the analog circuit 5 through a plurality of control lines 23, and generates a control signal to control the analog circuit 5. Furthermore, the logic circuit 6 may be controlled by the analog circuit 5 through a control line 23.

An ammeter 33 is placed between the external power source 31 and the power input terminal 8. Furthermore, an ammeter 34 is placed on the interterminal wiring 3a connecting the internal power output terminal 9 to the logic circuit power input terminal 10. The ammeters 33, 34 are set during the inspection of resting currents in the logic circuit 6 and the other circuits, and are not required during an ordinary use.

Figure 2:
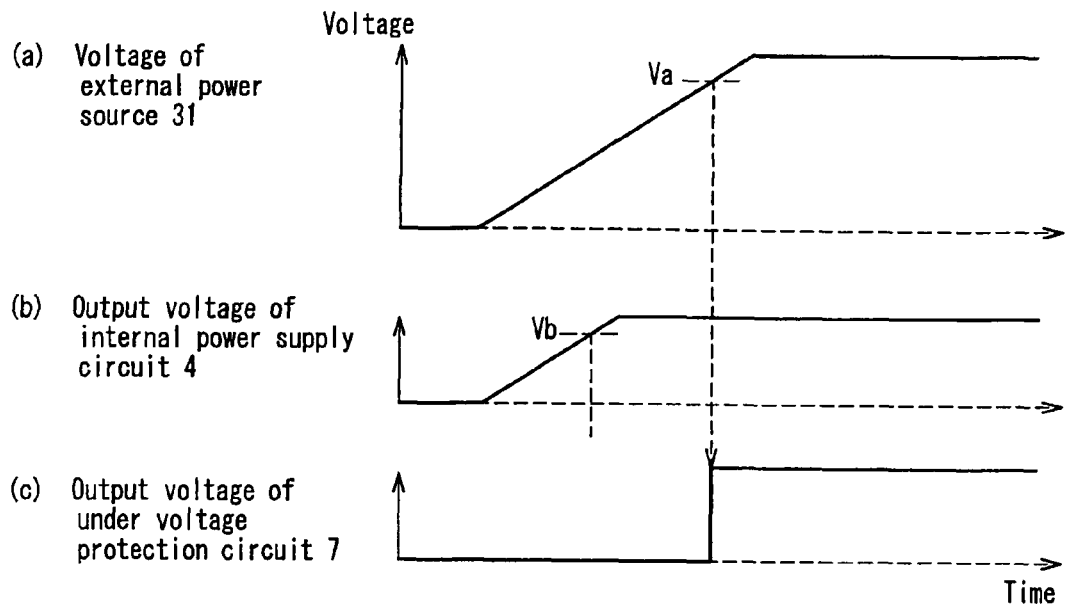
FIG. 2 is a diagram showing a voltage of an external power source (a), an output voltage of an internal power supply circuit (b), and an output voltage of an under voltage protection circuit (c) of the semiconductor device according to Embodiment 1 of the present invention.
Figure 3:
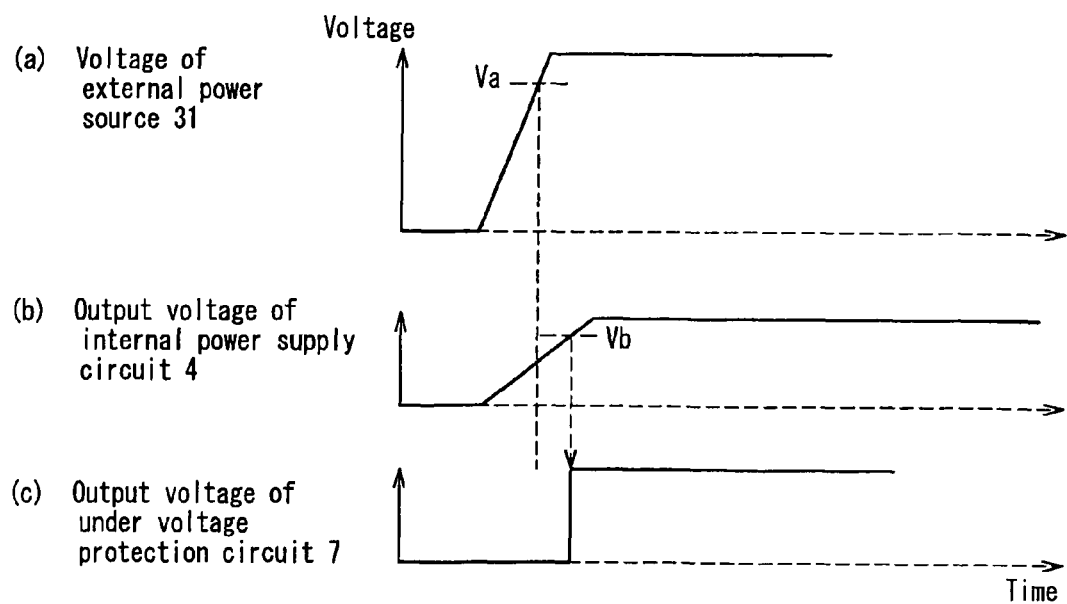
FIG. 3 is a diagram showing a voltage of an external power source (a), an output voltage of an internal power supply circuit (b), and an output voltage of an under voltage protection circuit (c) of the semiconductor device according to Embodiment 1 of the present invention.

Next, the reset control of the logic circuit 6 by the under voltage protection circuit 7 will be described in detail. In FIGS. 2 and 3, (a) illustrates an output voltage of the external power source 31, (b) illustrates an output voltage of the internal power supply circuit 4, and (c) illustrates an output voltage of the under voltage protection circuit 7, wherein the horizontal axis represents time. FIG. 2 is a graph in the case where the rising of an output voltage of the external power source 31 is slower than the rising of an output voltage of the internal power supply circuit 4. FIG. 3 is a graph in the case where the rising of an output voltage of the external power source 31 is faster than the rising of an output voltage of the internal power supply circuit 4.

In the figures, $V_a$, $V_b$ respectively represent a voltage set to be higher than a minimum voltage at which the analog circuit 5 is operable and a reference voltage set to be higher than a minimum voltage at which the logic circuit 6 is operable. The voltage of an output of the under voltage protection circuit 7 has two states: a Low (L) state (in which a voltage is low) and a High (H) state (in which a voltage is high), and the L state is a logic for resetting the logic circuit 6.

As shown in FIG. 2, in the case where the rising of an output voltage of the external power source 31 is slower than that of an output voltage of the internal power supply circuit 4, after the output voltage of the internal power supply circuit 4 reaches $V_b$, the output voltage of the external power source 31 reaches $V_a$. Therefore, the reset of the logic circuit 6 may be cancelled when both the analog circuit 5 and the logic circuit 6 become operable, i.e., the output voltage of the internal power supply circuit 4 reaches $V_a$.

On the other hand, as shown in FIG. 3, in the case where the rising of the output voltage of the external power source 31 is faster than that of the output voltage of the internal power supply circuit 4, after the output voltage of the external power source 31 reaches $V_a$, the output voltage of the internal power supply circuit 4 reaches $V_b$. Therefore, the reset of the logic circuit 6 may be cancelled when both the analog circuit 5 and the logic circuit 6 become operable, i.e., the output voltage of the external power source 31 reaches $V_b$.

Although the rising time of the external power source 31 has been described, the falling time of the external power source 31 also can be considered similarly.

Hereinafter, the operation of the semiconductor device 1a will be described. First, the operation of the semiconductor device 1a during an ordinary use will be described.

The external power source 31 supplies a voltage to the internal power supply circuit 4, and the internal power supply circuit 4 converts the supplied voltage into a predetermined voltage to output it. The output voltage is supplied to the analog circuit 5, the under voltage protection circuit 7, and the logic circuit 6 via the interterminal wiring 3a.

The under voltage protection circuit 7 determines whether or not the voltage of the external power source 31 and the voltage of the internal power supply circuit 4 are less than a predetermined voltage. If at least one of the voltages is less than the predetermined voltage, the under voltage protection circuit 7 resets the logic circuit 6. The analog circuit 5 is operated based on the voltage supplied from the internal power supply circuit 4.

The oscillator 52 generates a clock signal based on an input signal from the selector switching input terminal 11, and inputs the clock signal to the logic circuit 6. The logic circuit 6 generates a control signal using the voltage input through the interterminal wiring 3a and the clock signal, thereby controlling the analog circuit 5.

Next, the operation of the semiconductor device 1a in the inspection state will be described. The semiconductor device 1a is operated, and current values of the ammeters 33, 34 are read, whereby a resting current in the logic circuit 6 is inspected, and the quality of the semiconductor device 1a can be determined.

A consumption current (strictly, also containing a consumption current of the external circuit 32) in the semiconductor device 1a can be measured by reading the current value of the ammeter 33. Furthermore, a resting current in only the logic circuit 6, which is much smaller than a consumption current in the analog circuit 5 and needs to be inspected with good precision in an inspection tolerance, can be measured by reading the current value of the ammeter 34. The resting current as used herein refers to a leakage current from the power source of the logic circuit 6 while the entire gate output logic of the logic circuit 6 is fixed. The consumption currents are measured with the ammeters 33, 34 while the state of the entire gate output of the logic circuit 6 is reset by the under voltage protection circuit 7, or the logic of the entire gate output of the logic circuit 6 is set in a certain state by the clock input terminal 12, instead of the output signal from the oscillator 52 based on the control signal of the selector switching input terminal 11, whereby a resting current can be inspected.

Although a resting current has been described above, a defective product also can be detected by measuring a consumption current in the logic circuit 6 while setting the entire gate output logic of the logic circuit 6 in an operation state (in which the entire gate output logic is changing) instead of a fixed state with the oscillator 52 or the clock signal input from the dock internal terminal 12. Furthermore, the logic circuit 6 is based on the premise that it has a small resting current, and only a circuit in which the occurrence of defects needs to be managed strictly may be configured as the logic circuit 6. All the remaining circuits that are driven with the signal line 21 of the internal power supply circuit 4 also can be set to be the analog circuit 5 (including a logic circuit in which a resting current does not need to be inspected strictly). Similarly, the logic circuit 6 can include an analog circuit that has a small resting current and in which the occurrence of defects needs to be managed strictly.

While the internal power output terminal 9 and the logic circuit power input terminal 10 are not connected through the interterminal wiring 3a (before the interterminal wiring 3a is formed), a voltage is applied directly to the logic circuit power input terminal 10 from the outside, and a consumption current flowing through the logic circuit power input terminal 10, whereby a resting current in the logic circuit 6 may be inspected.

In order to inspect the resting current in the logic circuit 6 with high precision, it is necessary to inspect a resting current (irrespective of the combination of the respective gate output logic states) regarding the case where each gate is in an H state and the case where each gate is in an L state with respect to all the gates in the logic circuit 6.

First, by decreasing the voltage of the external power source 31 from a level at which the analog circuit 5 is operable to a level less than the lowest voltage at which the analog circuit 5 is operable, the under voltage protection circuit 7 resets the logic circuit 6 through the reset line 22. Consequently, one state of the H state and the L state can be inspected with respect to all the gates.

Next, a signal is input to the selector switching input terminal 11 to input the signal to the clock input terminal 12, whereby the logic circuit 6 is set in a controllable state. By inputting the control signal from the dock input terminal 12, a state opposite to the logic state in the case where each gate of the logic circuit 6 is reset can be obtained. The presence/absence of leakage of a resting current is inspected while each gate of the logic circuit 6 is set in a state opposite to the state in which each gate of the logic circuit 6 is reset. Actually, it is difficult to control the logic circuit 6 to a state opposite to the reset logic state, and hence, the presence/absence of leakage of a resting current is inspected over a plurality of times while the logic state of each gate output of the logic circuit 6 is being changed.

Although the case where the internal power output terminal 9 and the logic circuit power input terminal 10 are provided in the semiconductor device 1a has been described, the present invention is not limited to such a configuration. For example, the following configuration also is possible. A pad for outputting the signal line 21 (contact portion on the semiconductor chip for connecting the semiconductor chip to a package terminal through a wire) and a pad connected to a power source of the logic circuit 6 are provided separately on the semiconductor chip, and the pads are connected to a lead (contact portion as a package terminal for connecting the semiconductor chip to the package terminal through the wire) of one terminal in the package respectively through wires. In the case of this configuration, although a resting current in the logic circuit 6 cannot be inspected in a package assembly, it can be inspected in a wafer state (pellet state).

Due to the presence of the internal power output terminal 9 and the logic circuit power input terminal 10 in the semiconductor device 1a, a resting current in the logic circuit 6 can be inspected even in the stage where the semiconductor device 1a is assembled into a package (finished product). However, in the conventional package assembly, the one-terminal configuration is divided into two terminals: the internal power output terminal 9 and the logic circuit power input terminal 10, with the result that an ESD tolerance may be degraded. In contrast, in the semiconductor device a1 according to present embodiment, in the case where a voltage of a predetermined level or more is generated between the internal power output terminal 9 and the logic circuit power input terminal 10 due to the ESD, a current flows through the bypass line 24. Therefore, even in the case where both the plus ESD and the minus ESD are applied to the logic circuit power input terminal 10 or the internal power output terminal 9, a voltage causing withstand breakdown is not applied between the analog circuit 5 and the logic circuit 6. Thus, the ESD tolerance is not degraded compared with that of the conventional semiconductor device before one terminal is divided into two terminals: the logic circuit power input terminal 10 and the internal power output terminal 9.

Furthermore, the voltage of the analog circuit 5 and the voltage of the logic circuit 6 have the same potential when the internal power output terminal 9 and the logic circuit power input terminal 10 are connected to each other through the interterminal wiring 3a. However, before the connection of the interterminal wiring 3a or while the interterminal wiring 3a is removed, a voltage is generated between the analog circuit 5 and the logic circuit 6, and withstand breakdown may be caused even in the control line 23 between the analog circuit 5 and the logic circuit 6 and between the other circuits.

However, in the semiconductor device 1a according to the embodiment, in the case where a voltage of a predetermined level or more is generated between the internal power output terminal 9 and the logic circuit power input terminal 10, a current flows through the bypass line 24. Therefore, a voltage causing withstand breakdown is not applied between the analog circuit 5 and the logic circuit 6. Particularly, in an inspection process (inspection of a resting current in the logic circuit 6, etc.), in the case where the interterminal wiring 3a is removed, and a voltage is applied to the logic circuit power input terminal 10 from the outside, a large voltage can be prevented from being applied between the internal power output terminal 9 and the logic circuit power input terminal 10 due to the noise from the external applying device and the shift of an application timing.

When a resting current in the logic circuit 6 is inspected at the very end of the process of various inspections in the package assembly (finished product), a defective product in which the logic circuit 6 is broken due to the damage during the inspection of other items also can be removed.

As described above, in the semiconductor device 1a according to Embodiment 1 of the present invention, a resting current in the logic circuit 6 while the logic circuit 6 is reset and a resting current in the logic circuit 6 while each gate output in the logic circuit 6 varies can be inspected in a package assembly (finished product). Furthermore, in the semiconductor device 1a, the internal power output terminal 9 and the logic circuit power input terminal 10 are connected to each other through the bypass line 24 having the diodes 13, 14 in both directions, so that the degradation in the ESD tolerance and withstand breakdown of the internal power output terminal 9 and the logic circuit power input terminal 10 can be prevented.

Embodiment 2

Figure 4:
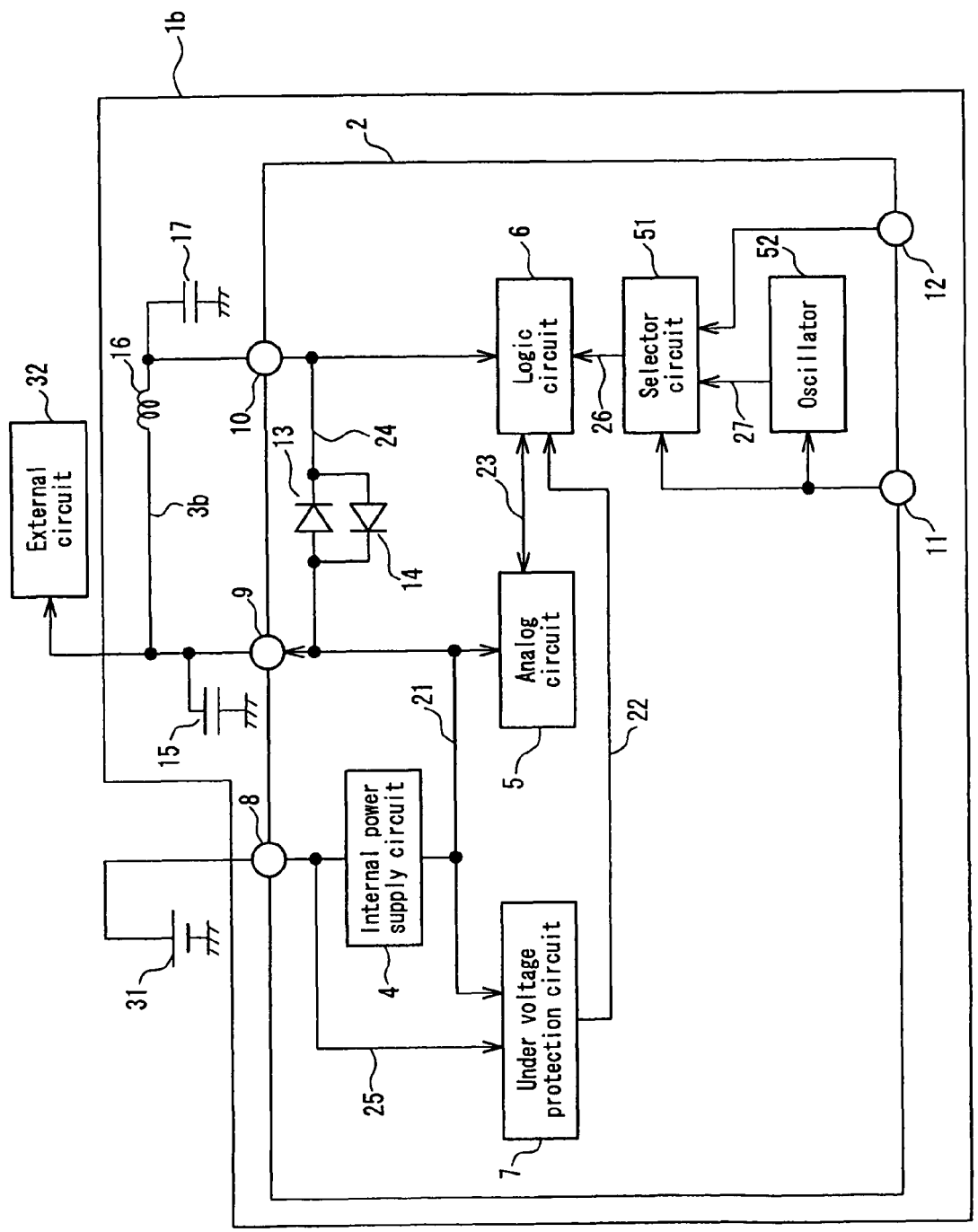
FIG. 4 is a block diagram showing a configuration of a semiconductor device according to Embodiment 2 of the present invention.

FIG. 4 is a block diagram showing a configuration of a semiconductor device 1b according to Embodiment 2 of the present invention. The constituent elements of the semiconductor device 1b similar to those of the semiconductor device 1a according to Embodiment 1 are denoted with the same reference numerals as those in Embodiment 1, and the description thereof will be omitted. Interterminal wiring 3b connects the internal power output terminal 9 and the logic circuit power input terminal 10. A coil 16 is placed on the interterminal wiring 3b, and capacitors 15, 17 with one end grounded are placed on the internal power output terminal 9 side of the coil 16 and on the logic circuit power input terminal 10 side thereof.

During an ordinary operation of the semiconductor device 1b, the logic circuit 6 receives a clock signal from the oscillator 52. In the semiconductor device 1a (and a conventional semiconductor device) of Embodiment 1, a clock signal is mixed in a power input to the logic circuit 6 as clock noise, and further is mixed in a signal to the analog circuit 5 through the interterminal wiring 3a, which may cause abnormality in characteristic precision of the signal of the analog circuit 5. In the present embodiment, since a filter is formed in the interterminal wiring 3b, clock noise from the logic circuit power input terminal 10 to the internal power output terminal 9 can be reduced.

Furthermore, the capacitor 17 can reduce the fluctuation in a voltage of the logic circuit power input terminal 10, and furthermore, can reduce noise from the internal power output terminal 9 to the logic circuit power input terminal 10.

The interterminal wiring 3b constitutes a filter, so that a large voltage is generated between the internal power output terminal 9 and the logic circuit power input terminal 10 in a transition state, and the voltage of the logic circuit power input terminal 10 may become lower than the voltage of the internal power output terminal 9. In this case, a current flows through the bypass line 24, the voltage between the internal power output terminal 9 and the logic power input terminal 10 decreases in a transition state, and the voltage of the logic circuit power input terminal 10 does not become lower than the lowest voltage at which the logic circuit 6 is operable.

Furthermore, in the case where the capacitor 17 and the like set the voltage of the internal power output terminal 9 to be smaller than the voltage of the logic circuit power input terminal 10 while the external power source 31 is in an OFF state, a current flows through the diode 14 of the bypass line 24. Thus, the difference in a voltage between the internal power output terminal 9 and the logic circuit power input terminal 10 decreases, whereby the logic circuit 6 is prevented from being subjected to withstand breakdown.

As described above, the semiconductor device 1b according to the present embodiment has a configuration in which the internal power output terminal 9 and the logic circuit power input terminal 10 are connected to each other through the interterminal wiring 3b having the coil 16 and the capacitor 17. Due to this configuration, clock noise from the logic circuit 6 to the analog circuit 5 (including the under voltage protection circuit 7) can be reduced. Furthermore, the difference in a voltage between the internal power output terminal 9 and the logic circuit power input terminal 10 caused by the interterminal wiring 3b during transition is reduced by the bypass line 24.

Clock noise also can be reduced by providing a filter using a resistor in place of the coil 16.

Embodiment 3

Figure 5:
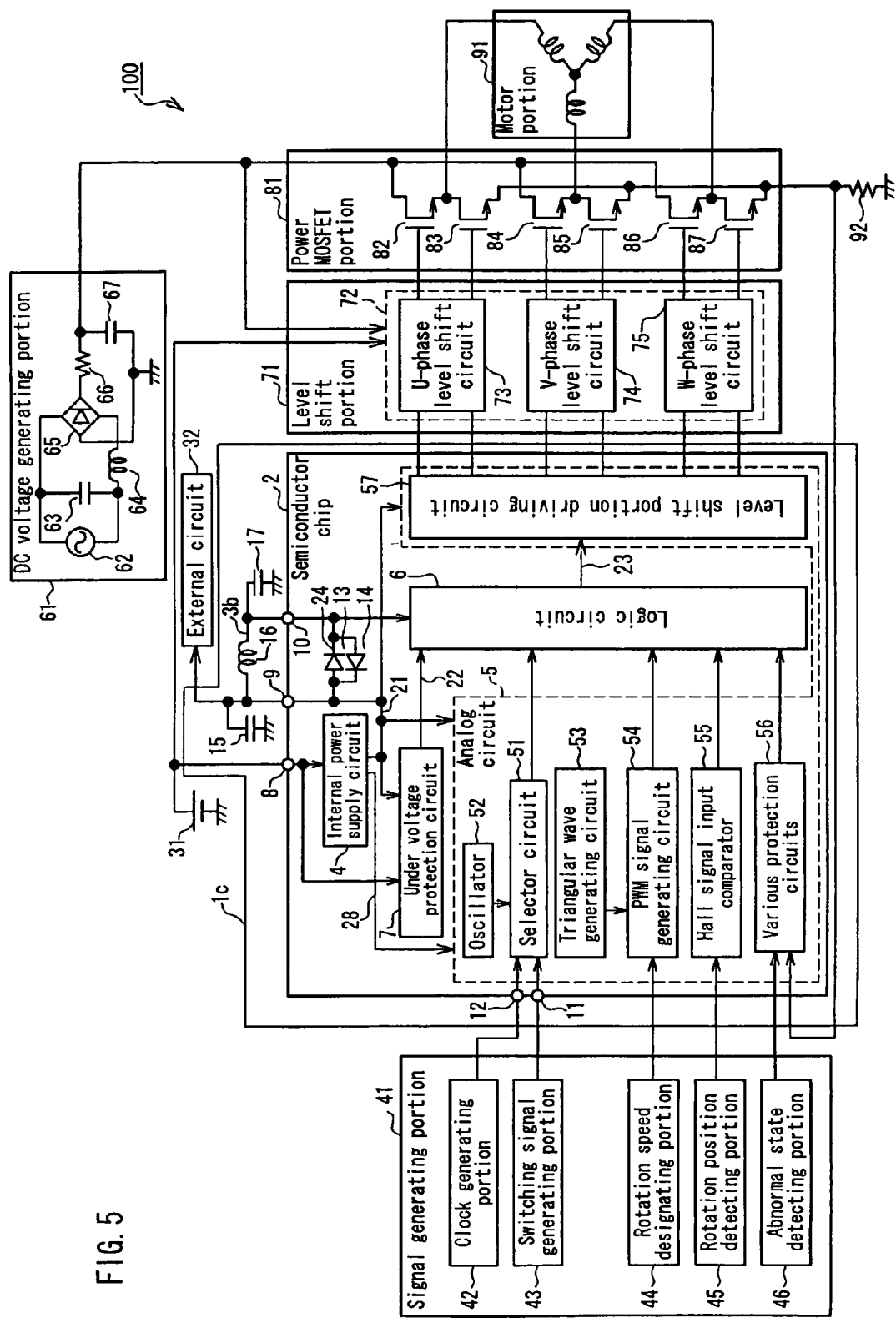
FIG. 5 is a block diagram showing a configuration of an electric motor according to Embodiment 3 of the present invention.
Figure 6:
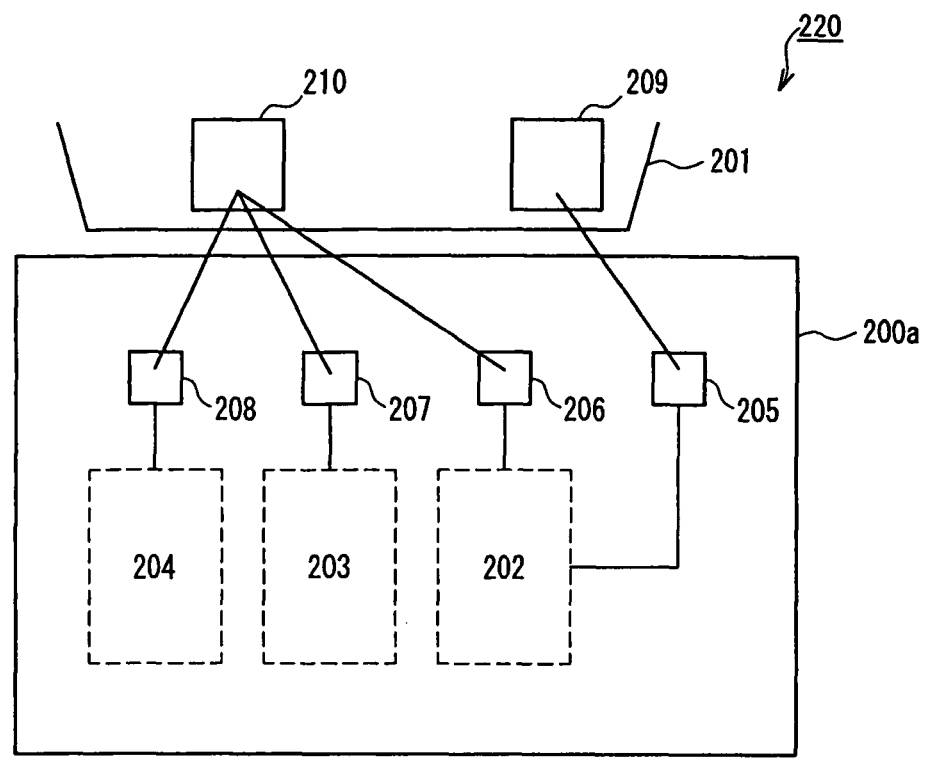
FIG. 6 is a block diagram showing a configuration of a conventional semiconductor device.
Figure 7:
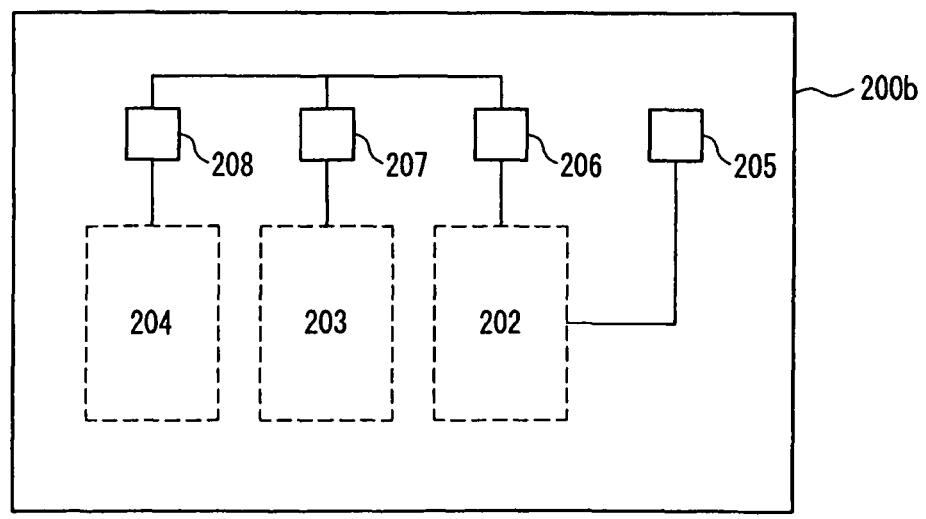
FIG. 7 is a block diagram showing a configuration of a conventional semiconductor device.

FIG. 5 is a block diagram showing a configuration of a three-phase motor 100 having a semiconductor device 1c according to Embodiment 3 of the present invention. The semiconductor device 1c according to the present embodiment shows the configuration of the semiconductor device 1b according to Embodiment 2 more specifically. The same constituent elements as those in the semiconductor device 1b are denoted with the same reference numerals as those therein, and the description thereof will be omitted. The semiconductor device 1c controls a motor portion 91.

The three-phase motor 100 includes a semiconductor device 1c, an external power source 31, an external circuit 32, a signal generating portion 41, a DC voltage generating portion 61, a level shift portion 71, a power MOSFET portion 81 for operating the motor portion 91, and the motor portion 91.

The DC voltage generating portion 61 converts an AC voltage into a DC voltage, and supplies the DC voltage to the level shift portion 71 and the power MOSFET portion 81. The DC voltage generating portion 61 outputs a DC voltage of about 141 V when the effective value of the voltage of the AC power source 62 is 100 V and a DC voltage of about 282 V when the effective value of the voltage of the AC power source 62 is 200 V. A capacitor 63, a four-terminal rectifier diode 65, and a coil 64 are connected to the AC power source 62 in parallel. One terminal of the rectifier diode 65 is grounded, and the other terminal of the rectifier diode 65 is connected to a resistor 66, thereby outputting a DC voltage to the outside. A capacitor 67 with one terminal grounded is connected to an output side of the resistor 66.

The signal generating portion 41 includes a clock generating portion 42, a switching signal generating portion 43, a rotation speed designating portion 44, a rotation position detecting portion 45, and an abnormal state detecting portion 46. The signal generating portion 41 inputs an instruction from an operator and a signal showing the state of the motor portion 91 to the semiconductor device 1c. The clock generating portion 42 generates a clock signal of the logic circuit 6 at a time of inspection, and inputs the clock signal to the selector circuit 51 via the clock input terminal 12. The switching signal generating portion 43 generates a signal designating whether the selector circuit 51 supplies the clock signal from the oscillator 52 or the clock signal from the clock generating portion 42 to the logic circuit 6.

The rotation speed designating portion 44 generates a signal designating the rotation speed of the motor portion 91, and inputs the signal to a PWM signal generating circuit 54. The rotation position detecting portion 45 detects the rotation position of the motor portion 91, and inputs a detection result to a Hall signal input comparator 55. An abnormal state detecting portion 46 detects abnormality in the three-phase motor 100, and inputs detection results to various protection circuits 56.

The external power source 31 supplies a voltage to the semiconductor device 1c and a level shift portion 71. The internal power supply circuit 4 (band gap circuit) converts the supplied voltage into those which have a plurality of predetermined heights. The converted voltage is supplied to the analog circuit 5 other than a level shift portion driving circuit 57 through a signal line 28. The voltage of the signal line 21 converted into a voltage different from that of the signal line 28 in the internal power supply circuit 4 (band gap circuit) is supplied to the analog circuit 5 (including the level shift portion driving circuit 57), the under voltage protection circuit 7, the external circuit 32, and the logic circuit 6 via the interterminal wiring 3b.

The analog circuit 5 converts a signal from the signal generating portion 41 so that the logic circuit 6 can process the signal, and the level shift portion driving circuit 57 converts the signal processed by the logic circuit 6 so that the level shift portion 71 can be operated. The PWM signal generating circuit 54 compares a triangular wave signal from a triangular wave generating circuit 53 with an output signal from the rotation speed designating portion 44, generates a PWM signal, and inputs it to the logic circuit 6.

The Hall signal input comparator 55 converts signals (U-phase, V-phase, W-phase signals) input from the rotation position detecting portion 45 into pulses and inputs them to the logic circuit 6. When the abnormal state detecting portion 46 detects abnormality, or an overcurrent flows through the power MOSFET portion 81 to increase an interterminal voltage of an overcurrent detecting resistor 92, the various protection circuits 56 input a signal canceling the abnormal state or the overcurrent state (operating a protection circuit) to the logic circuit 6.

The logic circuit 6 sends a pulse signal for each phase to the level shift portion driving circuit 57, and the level shift portion driving circuit 57 outputs a signal driving the level shift portion 71.

The level shift portion 71 includes a level shift circuit 72 having a U-phase level shift circuit 73, a V-phase level shift circuit 74, and a W-phase level shift circuit 75. The level shift circuit 72 converts a pulse signal at a low voltage input from the level shift portion driving circuit 57 of the semiconductor device 1c into a pulse signal at a high voltage for each phase, using the voltage from the DC voltage generating portion 61. Herein, the pulse signal at a low voltage is a signal whose voltage in an H state is close to the output voltage of the internal power supply circuit 4, and the pulse signal at a high voltage is a voltage whose voltage in an H state is close to the output voltage of the DC voltage generating portion 61. A pulse signal of the converted high voltage is input to a power MOSFET portion 81.

In the power MOSFET portion 81, first MOSFETs 82, 84, 86, and second MOSFETs 83, 85, 87 are connected, respectively. Terminals of the first MOSFETs 82, 84, 86, which are not connected to the second MOSFETs 83, 85, 87, are connected to the DC voltage generating portion 61. Furthermore, terminals of the second MOSFETs 83, 85, 87, which are not connected to the first MOSFETs 82, 84, 86, are grounded via the overcurrent detecting resistor 92. Contact points between the first MOSFETs 82, 84, 86 and the second MOSFETs 83, 85, 87 respectively are connected to a U-phase, a V-phase, and a W-phase of the motor portion 91.

As described above, according to the configuration in which the level shift portion 71 and the power MOSFET portion 81 driven by the semiconductor device 1c are driven with a voltage of the DC voltage generating portion 61, when there is a defect in the logic circuit 6 of the semiconductor device 1c, the level shift portion 71, the power MOSFET portion 81, and the motor portion 91 may be damaged severely. Furthermore, since the motor portion 91 is damaged severely, secondary breakdown to other devices may be caused.

For example, an abnormal signal is sent from the semiconductor device 1c, and the first MOSFET 82 and the second MOSFET 83 are turned on simultaneously even for a moment in the power MOSFET portion 81, the power MOSFET portion 81 is damaged severely due to the high current ability and high power voltage. Therefore, the defects in the logic circuit 6 of the semiconductor device 1c need to be removed with high precision and high probability. As a part thereof, the inspection of a resting current with high precision of the logic circuit 6 is important. Furthermore, the inspection of a resting current with respect to an assembly is important for removing a defect with higher probability. For these inspections of a resting current, the method shown in Embodiment 2 can be used.

Furthermore, as described above, according to the configuration in which a pulse at a high voltage is generated in the level shift portion 71 and the power MOSFET portion 81, and a large current flows, noise is mixed in a voltage in the analog circuit 5 through a wire or the like, which may cause abnormality in the precision of various analog properties. Furthermore, the analog circuit 5 and the logic circuit 6 malfunction for a moment due to noise, with the result that the level shift portion 71, the power MOSFET portion 81, and the motor portion 91 may be damaged severely as described above.

For example, in the case where the voltage of the signal line 21 is based on a comparator reference voltage of the various protection circuits 56, when noise is mixed in the signal line 21, noise also is mixed in the comparator reference voltage. Therefore, an input voltage is subjected to comparison processing while the various protection circuits 56 are shifted from a set reference value. The filter formed in the interterminal wiring 3b reduces noise from the logic circuit 6 to the analog circuit 5, or from the analog circuit 5 to the logic circuit 6. Furthermore, the interterminal wiring 3b can reduce the transmission of noise, which is input from the level shift portion 71 and the power MOSFET portion 81 to the logic circuit 6, to the analog circuit 5, and the transmission of noise, which is mixed in the analog circuit 5 from the level shift portion 71 and the power MOSFET portion 81, to the logic circuit 6.

Furthermore, due to the noise from the level shift portion 71 and the power MOSFET portion 81, it is conceivable that the difference in a voltage occurs between the analog circuit 5 and the logic circuit 6 (even in the case where the interterminal wiring 3a shown in Embodiment 1 without the coil 16 is connected, when a wiring impedance on a substrate and an impedance of a wire in a semiconductor device and the like are high, the difference in a potential is caused by noise), and withstand breakdown and characteristic abnormality are likely to occur. In this case, a current flows through the bypass line 24, whereby the quality of the motor improves without the occurrence of a large difference in a voltage between the analog circuit 5 and the logic circuit 6.

Furthermore, in the case of the outdoor use, noise further is generated due to external factors (water droplets, dust, etc.) and is likely to be transmitted. Even in such a case, a current flows through the bypass line 24 similarly, whereby the quality of a motor improves without the occurrence of a large difference in a voltage between the analog circuit 5 and the logic circuit 6.

Furthermore, the semiconductor device 1c may be placed adjacent to the level shift portion 71 and the power MOSFET portion 81, which are driven at a high voltage and allow a large current to flow therethrough to have a high heat generation amount, on the same substrate (furthermore, actually, the motor portion 91 also may be placed nearby). In particular, in the case of an environment that is unlikely to generate heat in which the semiconductor device 1c, the level shift portion 71, and the power MOSFET portion 81 are mounted on the same substrate in the motor, the ambient temperature of the semiconductor device 1c becomes very high. Therefore, the semiconductor device 1c needs to have the ability to operate normally even at a very high temperature. Thus, it is necessary to remove such a defective product that causes abnormality in the logic circuit 6 at a high temperature with high precision.

The above inspection of a resting current can be conducted under a high-temperature condition even in a wafer state or an assembly (finished product) state. Therefore, one of the wafer inspection and the assembly inspection is conducted under a high-temperature condition, and the other inspection is conducted under a room temperature condition, whereby a resting current can be inspected at different environment temperatures without increasing the number of inspections, whereby a cost can be suppressed.

Furthermore, in the case of the outdoor use, an environmental temperature varies largely depending upon a region to be used, so that it is necessary to inspect a resting current in the logic circuit 6 even in a low-temperature environment as well as a high-temperature environment. The inspection under a room temperature condition is conducted under a low-temperature condition in the inspection method of the present embodiment, whereby the inspection can be conducted without increasing the number of inspections.

According to a conventional method for inspecting a resting current by setting all the circuits other than the logic circuit 6 in an unoperating state, and setting conditions (inputting voltages) from the outside through a plurality of control lines 23 controlling the logic circuit 6 from the analog circuit 5 simultaneously, a leakage current from the analog circuit 5 increases under a high-temperature environment. Thus, a resting current in the logic circuit 6 cannot be inspected with good precision with a narrow tolerance. According to the inspection method of the present embodiment, a resting current in the logic circuit 6 can be inspected with good precision irrespective of an environment temperature.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device, comprising:
   a power input terminal;
   an internal power supply circuit that converts a voltage supplied from outside to the power input terminal into a first predetermined voltage;
   an analog circuit connected to an output side of the internal power supply circuit;
   an internal power output terminal connected to the output side of the internal power supply circuit;
   a logic circuit power input terminal;
   a logic circuit connected to the logic circuit power input terminal;
   an under voltage protection circuit that resets the logic circuit when at least one of the following states is obtained: a state in which a voltage of the power input terminal is a second predetermined voltage or less and a state in which a voltage on the output side of the internal power supply circuit is a third predetermined voltage or less; and
   an interterminal wiring connecting the internal power output terminal to the logic circuit power input terminal.

2. The semiconductor device according to claim 1, wherein the output side of the internal power supply circuit and a power input side of the logic circuit are connected to each other, and an ESD (electrostatic discharge) protection circuit is inserted to be connected.

3. The semiconductor device according to claim 2, wherein the ESD protection circuit is composed of two diodes connected in parallel in directions opposite to each other.

4. The semiconductor device according to claim 1, wherein a capacitor with one end grounded is connected to the interterminal wiring.

5. The semiconductor device according to claim 1, comprising:
   an oscillator that generates a clock signal;

a clock input terminal that receives a clock signal from outside; and a selector that selects either one of the clock signal generated by the oscillator and the clock signal input via the clock input terminal, as a clock signal of the logic circuit.

6. The semiconductor device according to claim 5, wherein the selector stops an operation of the oscillator, when the clock signal input via the clock input terminal is used as the clock signal of the logic circuit.

7. A method for inspecting the semiconductor device of claim 5, comprising:

supplying a voltage to the logic circuit power input terminal from outside of the semiconductor device; and measuring a resting current flowing to the logic circuit power input terminal to determine quality, while the internal power output terminal and the logic circuit power input terminal are not connected to each other with the interterminal wiring.

8. The method for inspecting the semiconductor device according to claim 7, comprising resetting the logic circuit with the under voltage protection circuit.

9. The method for inspecting the semiconductor device according to claim 8, comprising setting a voltage of the power input terminal to be the second or third predetermined voltage or less, thereby resetting the logic circuit with the under voltage protection circuit.

10. A method for inspecting the semiconductor device of claim 5, comprising inputting a clock signal to the logic circuit via the clock input terminal to set a logic state of each gate of the logic circuit, and measuring a resting current flowing to the logic circuit power input terminal to determine quality.

11. The method for inspecting a semiconductor device according to claim 10, further comprising changing the logic state of each gate of the logic circuit, and measuring a resting current flowing to the logic circuit power input terminal.

12. The method for inspecting a semiconductor device according to claim 10, further comprising measuring a resting current flowing to the logic circuit power input terminal while the logic circuit is reset.

13. The semiconductor device according to claim 1, wherein the internal power output terminal and the logic circuit power input terminal are formed as a common terminal.

14. The semiconductor device according to claim 1, wherein a filter is formed in the interterminal wiring.

15. The semiconductor device according to claim 14, wherein the filter has a coil or a resistor, and a capacitor with one end grounded, the capacitor being provided between the coil or resistor and the logic circuit power input terminal or between the coil or resistor and the internal power output terminal.

16. A method for inspecting the semiconductor device of claim 1, comprising:

supplying a voltage to the logic circuit power input terminal from outside of the semiconductor device; and measuring a resting current flowing to the logic circuit power input terminal to determine quality, while the internal power output terminal and the logic circuit power input terminal are not connected to each other with the interterminal wiring.

17. An electric motor, comprising:

the semiconductor device of claim 1, including a level shift portion driving circuit that increases an output signal driving ability of the logic circuit:

a level shift portion that converts an output signal from the level shift portion driving circuit into a high-voltage signal;

a motor portion; and a power MOSFET portion that is driven with an output signal from the level shift portion to drive the motor portion, wherein the semiconductor device, the level shift portion, and the power MOSFET portion are formed on the same substrate.

* * * * *